United States Patent
Yang et al.

(10) Patent No.: US 7,081,269 B2
(45) Date of Patent: Jul. 25, 2006

(54) METHOD OF FABRICATING PATTERNED POLYMER FILM WITH NANOMETER SCALE

(75) Inventors: Seung-Man Yang, Daejeon (KR); Se Gyu Jang, Daejeon (KR); Dae-Geun Choi, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 142 days.

(21) Appl. No.: 10/761,277

(22) Filed: Jan. 22, 2004

(65) Prior Publication Data

US 2004/0265490 A1 Dec. 30, 2004

(30) Foreign Application Priority Data

Jun. 27, 2003 (KR) .......................... 10-2003-42676

(51) Int. Cl.
B05D 5/12 (2006.01)
(52) U.S. Cl. ..................... 427/130; 427/240; 427/430.1
(58) Field of Classification Search ................ 427/133, 427/240, 430.1
See application file for complete search history.

(56) References Cited

U.S. PATENT DOCUMENTS

| | | | |
|---|---|---|---|
| 4,420,527 A * | 12/1983 | Conley ......................... | 428/172 |
| 5,289,311 A * | 2/1994 | McClelland et al. ......... | 359/457 |
| 5,554,432 A * | 9/1996 | Sandor et al. ................ | 428/157 |
| 5,761,801 A * | 6/1998 | Gebhardt et al. ............. | 29/846 |
| 6,375,870 B1 | 4/2002 | Visovsky et al. | |
| 6,517,995 B1 * | 2/2003 | Jacobson et al. ........... | 430/320 |
| 6,656,790 B1 * | 12/2003 | Jang et al. .................. | 438/253 |
| 6,866,801 B1 * | 3/2005 | Mau et al. .................. | 264/29.1 |

OTHER PUBLICATIONS

Aizenberg, J. et al., "Patterned Colloidal Deposition Controlled by Electrostatic and Capillary Forces," *Physical Review Letters*, vol. 84, No. 13, pp. 2997-3000, The American Physical Society (2000).
Bechinger, C. et al., "Submicron metal oxide structures by a sol-gel process on patterned substrates," *Thin Solid Films*, vol. 366, pp. 135-138, Elsevier Science S.A. (2000).
Chen, W. and H. Ahmed, "Fabrication of 5-7 nm wide etched lines in silison using 100 keV electron-beam lithography and polymethylmethacrylate resist," *Applied Physics Letters*, vol. 62, No. 13, pp. 1499-1501, The American Institute of Physics (1993).

(Continued)

*Primary Examiner*—Bret Chen
(74) *Attorney, Agent, or Firm*—Sterne, Kessler, Goldstein & Fox P.L.L.C.

(57) ABSTRACT

A method of fabricating a patterned polymer film with nanometer scale includes filling particles each having a predetermined size in a pattern provided to a soft polymer mold to prepare an embossed stamp; placing the embossed stamp on a desired polymer film; allowing the embossed stamp placed on the polymer film to stand at temperatures higher than a glass transfer temperature of the polymer film for a predetermined time; and releasing the embossed stamp from the polymer film. Alternatively, the patterned polymer film is obtained by filling particles each having a predetermined size in a pattern provided to a soft polymer mold to prepare an embossed stamp; placing the embossed stamp on a coating layer of a polymer precursor formed on a substrate; curing the coating layer; and releasing the embossed stamp from the cured coating layer.

12 Claims, 10 Drawing Sheets

OTHER PUBLICATIONS

Chou, S. Y. et al., "Imprint Lithography with 25-Nanometer Resolution," *Science*, vol. 272, pp. 85-87, The American Institution for the Advancement of Science (1996).

Dimitrov, A.S. and K. Nagayama, "Continuous Convective Assembling of Fine Particles into Two-Dimensional Arrays on Solid Surfaces," *Langmuir: The ACS Journal of Surfaces and Colloids*, vol. 12, No. 5, pp. 1303-1311, The American Chemical Society (1996).

Frigo, N.J., "Passive Optical Networks," *Optics & Photonics News*, pp. 24-29 (1996).

Hagleitner, C. et al., "Smart single-chip gas sensor microsystem," *Nature*, vol. 414, Issue No. 6861, pp. 293-296, Nature Publishing Group (2001).

Heegr, A.J. and J. Long Jr., "Conjugating polymers," *Optics & Photonics News*, pp. 24-30 (1996).

Hulteen, J.C. et al., "Nanosphere Lithography Size-Tunable Silver Nanoparticle and Surface Cluster Arrays,"*Journal of Physical Chemistry* B, vol. 103, No. 19, pp. 3854-3863, The American Chemical Society (1999).

Kim, S.-R et al., "Fabrication of Polymeric Substrates with Well-Defined Nanometer-Scale Topography and Tailored Surface Chemistry," *Advanced Materials*, vol. 14, No. 20, pp. 1468-1472, Wiley-VCH Verlag GmbH & Co. (Oct. 2002).

Krug, C. and J.F. Hartwig, "Direct Observation of Aldehyde Insertion into Rhodium-Aryl and—Alkoxide Complexes," *Journal of the American Chemical Society*, vol. 124, No. 8, pp. 1674-1679, The American Chemical Society (published on web Jan. 2002).

Kumar, A. and G.M. Whitesides, "Features of gold having micrometer to centimeter dimensions can be formed through a combination of stamping with an elastomeric stamp and an alkanethiol "Ink" followed by chemical etching," *Applied Physics Letters*, vol. 63, No. 14, pp. 2002-2004, The American Institute of Physics (1993).

Li, H. et al., "High-Resolution Contact Printing with Dendrimers," *Nano Letters*, vol. 2, No. 4, pp. 347-349, The American Chemical Society (published on web Feb. 2002).

Li, H.-W. et al., "Nanocontact Printing: A Route to Sub-50-nm-Scale Chemical and Biological Patterning," *Langmuir: The ACS Journal of Surfaces and Colloids*, vol. 19, No. 6, pp. 1963-1965, The American Chemical Society (published on web Jan. 2003).

Mikrajuddin, F.I. and K. Okuyama, "Single Route for Producing Organized Metallic Domes, Dots, and Pores by Colloidal Templating and Over-Sputtering," *Advanced Materials*, vol. 14, No. 12, pp. 930-933, Wiley-VCH Verlag GmbH (Jun. 2002).

Odom, T.W. et al., "Improved Pattern Transfer in Soft Lithography Using Composite Stamps," *Langmuir: The ACS Journal of Surfaces and Colloids*, vol. 18, No. 13, pp. 5314-5320, The American Chemical Society (published on web May 2002).

Schmid, H. and B. Michel, "Siloxane Polymers for High-Resolution, High-Accuracy Soft Lithography," *Macromolecules*, vol. 33, No. 8, pp. 3042-3049, The American Chemical Society (2000).

Sprenger, M. et al., "Hierarchical Pattern Replication by Polymer Demixing," *Advanced Materials*, vol. 15, No. 9, pp. 703-706, Wiley-VCH Verlag GmbH & Co. (May 2003).

Velev, O.D. et al., "A Class of Microstructured Particles Through Colloidal Crystallization," *Science*, vol. 287, No. 5461, pp. 2240-2243, The American Association for the Advancement of Science (2000).

Werts, M.H.V. et al., "Nonometer Scale Patterning of Langmuir-Blodgett Films of Gold Nanoparticles by Electron Beam Lithography," *Nano Letters*, vol. 2, No. 1, pp. 43-47, The American Chemical Society (published on web 2001).

Winzer, M. et al., "Fabrication of nano-dot and nano-ring-arrays by nanosphere lithography," *Applied Physics A: Materials Science & Processing*, vol. 63, pp. 617-619, Springer-Verlag (1996).

Wu, M.-H. and G.M. Whitesides, "Fabrication of arrays of two-dimensional micropatterns using microspheres as lenses for projection photolithography," *Applied Physics Letters*, vol. 78, No. 16, pp. 2273-2275, The American Institute of Physics (2001).

Wu, W. et al., "Large area high density quantized magnetic disks fabricated using nanoimprint lithography," *Journal of Vacuum Science and Technology B*, vol. 16, No. 6, pp. 3825-3829, The American Vacuum Society (1998).

Xia, Y. et al., "Non-Photolithographic Methods for Fabrication of Elastomeric Stamps for Use in Microcontact Printing," *Langmuir: The ACS Journal of Surfaces and Colloids*, vol. 12, No. 16, pp. 4033-4038, The American Chemical Society (1996).

Xia, Y. and G.M. Whitesides, "Soft Lithography," *Angewandte Chemie*, vol. 37, No. 5, pp. 551-575, Wiley-VCH Verlag GmbH (1998).

Yang, S.M. and G.A. Ozin, "Opal chips: vectorial growth of colloidal crystal patterns inside silicon wafers," *Chemical Communications*, vol. 24, pp. 2507-2509, The Royal Society of Chemistry (2000).

Yi, D.K. and D.-Y. Kim, "Polymer nanosphere lithography: fabrication of an ordered trigonal polymeric nanostructure," *Chemical Communications*, vol. 8, pp. 982-983, The Royal Society of Chemistry (published on web Mar. 2003).

Yi, G.-R. and S.-M. Yang, "Microstructure of Porous Silica Prepared in Aqueous and Nonaqueous Emulsion Templates," *Chemistry of Materials*, vol. 11, No. 9, pp. 2322-2325, The Royal Society of Chemistry (1999).

* cited by examiner

METHOD OF FABRICATING PATTERNED POLYMER FILM WITH NANOMETER SCALE

This application claims priority to Korean Patent Application No. 2003-42676, filed Jun. 27, 2003, which is incorporated herein by reference in its entirety.

BACKGROUND OF THE INVENTION

1. Field of the Invention

The present invention relates to preparation methods of regular polymer patterns for the fabrication of small electronic and optical devices, and methods of fabricating a nano-patterned polymer film, characterized in that polymer patterns having nanometer sized line widths therebetween (which are difficult to realize by a photolithography or electron beam process) can be quickly and inexpensively fabricated at desired positions by use of a self-assembling process and a soft lithography process.

2. Related Art

Research on new fabrication processes for fine patterns having 100 nanometer or less scale, instead of a conventional photolithography process, has been a subject of much interest recently. Miniaturization and high integration of semiconductor devices result in decreasing manufacturing time and cost, and improve performance. However, when using a conventional semiconductor photolithography process, it is difficult to fabricate patterns having line widths of 100 nanometer or less, because of the limitation of the photolithographic resolution.

Therefore, electron beam lithography or X-ray lithography have been used to obtain such fine patterns. Although these methods result in finer line widths and higher resolution compared to photolithography, they require expensive equipment and long processing periods.

Further, a soft lithography process has been proposed as an alternative patterning method, in which a soft material such as polydimethylsiloxane is used as a mask to form the pattern. This has the advantages of inexpensive costs and short processing periods (see *Angew. Chem. Int. Ed.* 37:550 (1998); *Appl. Phys. Lett.* 63:2002 (1993); *J. Am. Chem. Soc.* 124:1676 (2002); *Langmuir* 19:1963 (2003); *Nano lett.* 2:347 (2002); *Langmuir* 18:5314 (2002); *Macromolecules* 33:3042 (2000)).

However, for the soft lithography process, sizes and line widths of the resulting patterns are defined by the size and shape of an original master. To manufacture the original fine master, electron beam lithography has to be used.

To solve the above problems, formation methods of nano-patterns that use a self-assembling process of nano-particles have been proposed. The self-assembling process is advantageous in terms of controllable sizes and intervals of the pattern according to the selection of the particles, low fabrication costs and short periods required for fabrication of the desired patterns. However, conventional methods of forming the nano-patterns have a problem in that desired patterns cannot be prepared at desired positions by only self-assembly (see *Chem. Mater.* 11:2322 (1999); *Science* 287:2240 (2000); *Nature* 414:293 (2001); *Adv. Mater.* 14:930 (2002); *Chem. Commun.* 982 (2003); *Adv. Mater.* 15:703 (2003); *Langmuir* 12:4033 (1996); *Appl. Phys. Lett.* 78:2273 (2001)).

SUMMARY OF THE INVENTION

Therefore, it is an object of the present invention to alleviate the problems encountered in the related art and to provide a method of fabricating a patterned polymer film with nanometer scale, characterized in that polymer patterns having nanometer sized line widths therebetween (which are difficult to realize by a photolithography or electron beam process) can be rapidly and inexpensively fabricated at desired locations by use of a self-assembling process and a soft lithography process.

According to a first embodiment of the present invention, there is provided a method of fabricating a patterned polymer film comprising filling particles of a predetermined size in a pattern provided to a soft polymer mold to prepare an embossed stamp, placing the embossed stamp on a desired polymer film, allowing the stamp to stand at temperatures higher than a glass transfer temperature of the polymer film for a predetermined time, and releasing the embossed stamp from the polymer film.

In another embodiment of the present invention, there is provided a method of fabricating a patterned polymer film comprising filling particles of a predetermined size in a pattern provided to a soft polymer mold to prepare an embossed stamp, placing the embossed stamp on a coating layer of a polymer precursor formed on a substrate, curing the coating layer, and releasing the embossed stamp from the cured coating layer.

DETAILED DESCRIPTION OF THE INVENTION

Figure 1:
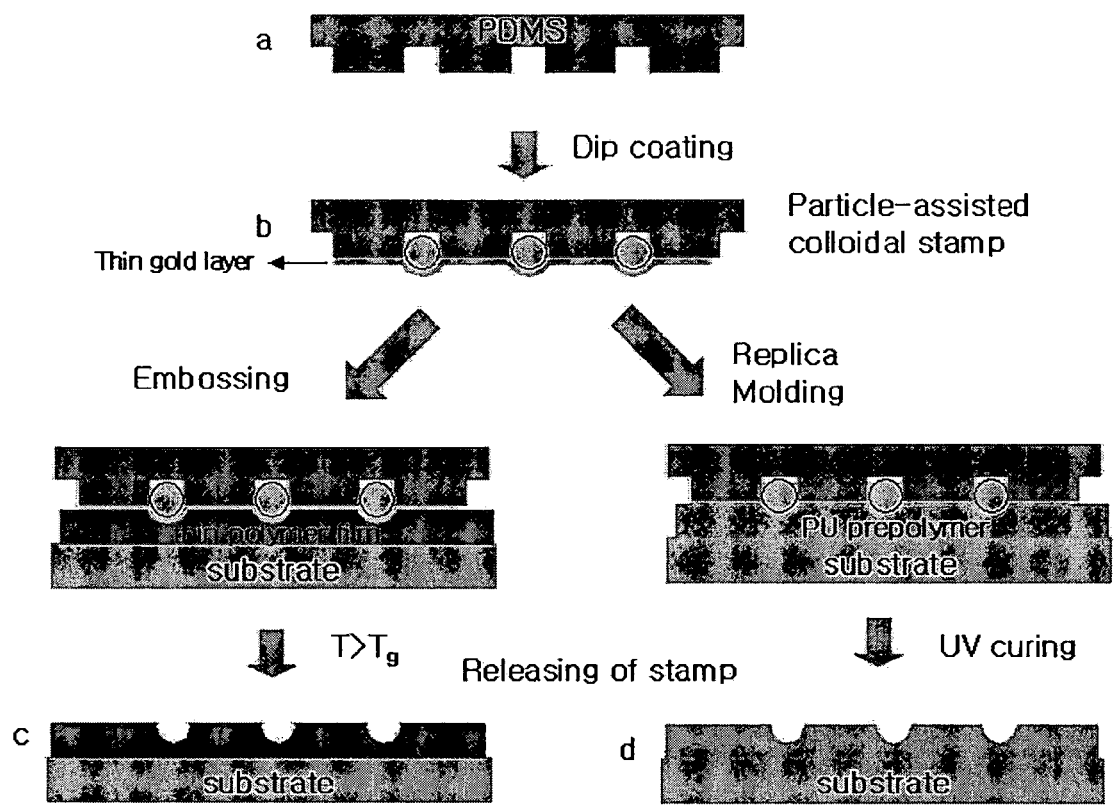
FIG. 1 is a sectional view showing a process of sequentially fabricating a nano-patterned polymer film of the present invention.

In some embodiments of the present invention, in order to fabricate a patterned polymer film, particles of a predetermined size are filled in a pattern of a soft polymer mold, so as to prepare an embossed stamp. Then, the embossed stamp is placed on a host polymer film, and allowed to stand at temperatures higher than a glass transfer temperature of the polymer film for a predetermined time. The embossed stamp is then removed from the polymer film.

Alternatively, a patterned polymer film is obtained by filling particles of a predetermined size in a pattern of a soft polymer mold, so as to prepare an embossed stamp. The embossed stamp is then placed on a coating layer of a polymer precursor, which is formed on a substrate. Thereafter, the coating layer is cured, and the embossed stamp is released from the cured coating layer.

The soft polymer mold usable in the present invention is replicated from a master patterned with a predetermined shape, which is obtained by a soft lithography process exemplified by replica molding (see *Angew. Chem. Int. Ed.* 37:550 (1998); *Adv. Mater.* 9:147 (1997)), imprinting (*Nature* 417:835 (2002); *J. Vac. Sci. Technol. B.* 16:3825 (1998)), micromolding in capillary (*Nature* 376:581 (1995)), transfer molding (*Adv. Mater.* 8:837 (1996)), decal transfer molding (*J. AM. Chem. Soc.* 124:13583 (2002)), and solvent assisted micromolding (*Adv. Mater.* 9:6517 (1997)).

Various materials, such as quartz, glass, metal plates, and polymer soft materials can be used as the substrate or patterned master, in addition to a silicon wafer for a conventional photolithography process. The polymer soft material has a predetermined strength at room temperature and stable properties in an aqueous solution, and includes, for example, polystyrene, polyurethane, polymethylmethacrylate, polyimide, etc.

The patterning of the master material can be performed by using an electron beam (see *Appl. Phys. Lett.* 62:1499 (1993); *Nano Lett.* 2:43 (2002)) or photolithography (*Semiconductor International* 54 (1998); *Optics & Photonic News* 7:29 (1996)). As such, the pattern is not limited to any particular shape, and can be prepared in a desired shape, as required for the manufacturing process.

The material for use in the soft polymer mold is not particularly limited, so long as it has a predetermined strength at room temperature and is stable in an aqueous solution. The material can be, for example, polydimethylsiloxane, polyurethane, epoxy, polystyrene, polyimide, polyacrylonitrile, polymethylmethacrylate, polyurea, and mixtures thereof.

Although the particles filled in the pattern of the soft polymer mold are not particularly limited, they can have monodisperse properties and uniform sizes, with strength at room temperature. The particles can be, e.g., polymer beads, metallic materials, ceramics, and mixtures thereof. Of the above particles, the polymer beads have monodispersive particles with strength at room temperature, and are not particularly limited so long as they are suitable for self-assembling and patterning. Examples of the polymer beads include polystyrene, polymethylmethacrylate, polyacrylate, polyurea, polyurethane, epoxy, polydimethylsiloxane, polyacrylamide, polyvinylalcohol, polybutadiene, polypropylene, polyethylene, polyethyleneoxide, and copolymers thereof. The metallic materials are not particularly limited so long as they satisfy the above requirements. The metallic materials are exemplified by inorganic metals, such as titanium, aluminum, iron, gold, cadmium sulfide, lead sulfide, lead chloride, copper, silica, etc.

The sizes and shapes of the particles are not particularly limited so long as they can be filled in the desired pattern. Thus, the particles with diameters ranging from several micrometers down to hundreds of nanometers can be used, depending on the size of the pattern.

The filling process of the particles into the engraved pattern is not particularly limited, and includes dip coating which disperses the particles into the solution (*Langmuir.* 12:1303 (1996)), spin coating (*J. Phys. Chem. B.* 103:3854 (1999); *Appl. Phys. A* 63:617 (1996)), or flowing by capillary force (*Phys. Rev. Lett.* 84:2997 (2000); *Chem. Commun.* 2507 (2000)).

The soft polymer mold filled with the particles is used as a stamp to obtain a polymer pattern. The filled particles protrude in a predetermined pattern from the surface of the soft polymer mold, resulting in the fine polymer pattern according to nano-imprinting or replica molding.

In some embodiments of the present invention, the stamp is positioned on the polymer film, and allowed to stand at temperatures higher than a glass transfer temperature of the used polymer for a predetermined time. Thereby, an engraved porous pattern is formed on the polymer film.

In this case, the usable polymer film materials are not particularly limited, and can be, for example, polystyrene, polymethylmethacrylate, polyacrylate, polyurea, polyurethane, epoxy, polydimethylsiloxane, polyacrylamide, polyvinylalcohol, polybutadiene, polypropylene, polyethylene, polyethyleneoxide, and copolymers thereof.

In some embodiments of the present invention, the stamp is positioned on the substrate coated with the polymer precursor, after which the polymer precursor is cured by heat or UV treatment, to form the engraved porous pattern on the polymer film. Alternatively, the stamp can be first placed on the substrate, and then the polymer precursor can be applied and cured.

To obtain the engraved fine polymer pattern, the self-assembled particles in the patterned mold should be stably maintained without being disordered upon the pattern transfer. To accomplish this, a polymer impregnation-prevention layer can be coated onto the stamp. Materials for the polymer impregnation-prevention layer are not particularly limited, and can include gold, silver, palladium, copper, chromium, titanium, and mixtures thereof. The polymer impregnation-prevention layer functions to prevent the particles of the stamp from releasing upon the pattern transfer, attributed to complete impregnation of the polymer into the particles.

FIG. 1 is a sectional view showing a patterned soft polymer mold 102. The mold 102 is prepared from a silicon master, which is usually manufactured using an electron beam or photolithography process by the replica molding of the soft lithography process.

The soft polymer mold 102 is composed of polydimethylsiloxane. A stamp 104 is provided with the self-assembled nanoparticles 106 by filling a dispersion of the monodisperse nanoparticles 106 into channels 108 of the soft polymer mold 102 using a self-assembly process. As such, in cases where the particles 106 and the mold 102 have the same polarity charge, the particles 106 are absent from the surface of the mold 102 due to repulsive force, and are arrayed into the engraved channels of the pattern by the capillary force. Here, the particles 106 can include silica nanoparticles. A gold layer 105 can be used to cover the stamp 104 and the particles 106, to act as an impregnation-prevention layer.

For nano-imprinting (embossing), a polymer film 110 is formed on a substrate 102, such as glass or a semiconductor wafer, using a spin coating process. Then, the stamp 104 is placed on the polymer film 110 and allowed to stand at temperatures higher than a glass transfer temperature of the polymer film 110 (T>Tg), thus inducing fluidity of the polymer film 110. After a predetermined time, the stamp 104 is released from the polymer film 110, and thus an engraved polymer film 110A having a predetermined pattern. In such a case, the polymer film 110A can include polystyrene.

Alternatively, in order to prepare the polymer film directly patterned by the replica molding, polymer precursor 114 is coated on the substrate 112, and the stamp 104 is placed on the polymer precursor 114. Thereafter, the polymer precursor 114 is cured by heat or UV, thereby obtaining the desired engraved polymer pattern shown in FIG. 1. There, a polyurethane (PU) precursor 114 is used, and a UV curing process is used for curing the precursor 114.

The fabricating method of the present invention shown in FIG. 1 has the following advantages, compared to a conventional "top-down" process by photolithography or electronic beam lithography, and a conventional "bottom-up" process using only self-assembly of particles.

First, it is possible to achieve fine patterning with line widths between lines of 100 nanometer or less, which is difficult to achieve by a conventional photolithography process. Further, such fine patterning can be rapidly and easily achieved by a simpler process than electron beam lithography. Also, the polymer pattern of the present invention can be easily fabricated with a gradient that is impossible to realize by a conventional semiconductor process. The polymer pattern also can have the line widths of various sizes, depending on the selected particles. In particular, the method described above can be repeatedly performed in a short period if there is the master, resulting in mass fabrication of the desired polymer pattern.

Second, the pattern described above has fewer drawbacks than conventional patterns resulting from only the self-assembly of particles. Moreover, in the present invention, only desired portions can be patterned.

Third, there are few limitations on materials that can be used, while a conventional process requires specific material restrictions and expensive processing steps.

Having generally described this invention, a further understanding can be obtained by reference to the examples which are provided herein for purposes of illustration only and are not intended to be limiting.

EXAMPLE 1

Preparation of Engraved Porous Polymer Pattern by Replica Molding

Figure 2A:
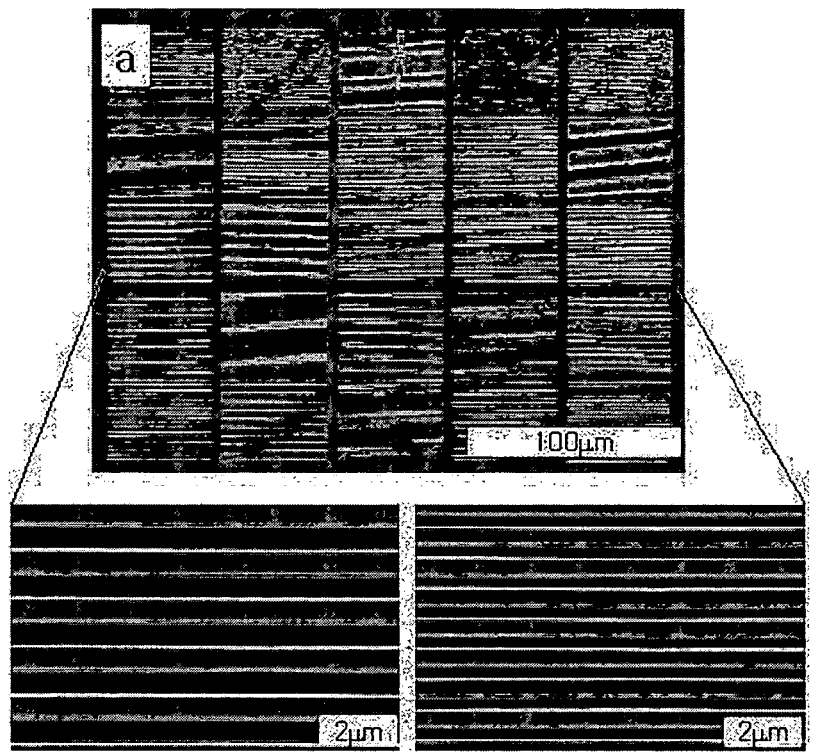
FIG. 2A is an electron micrograph of a polydimethylsiloxane mold replicated on a master.
Figure 2B:
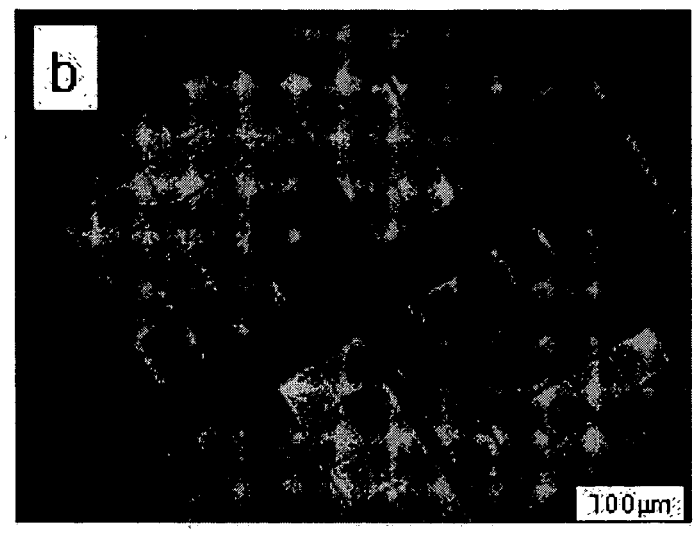
FIG. 2B is an optical micrograph of the polydimethylsiloxane mold replicated on the master.

To fabricate a soft polymer mold having line widths of various sizes, a quartz master produced by electron beam lithography process was used. First, polydimethylsiloxane (PDMS) as a soft polymer material was poured on the master and then cured at 80° C. for 1 hour. FIG. 2A is an electron micrograph of the PDMS mold, which was poured to the master, replicated and then completely cured. FIG. 2B is an optical micrograph of the same PDMS mold, which displays different colors (in this figure, as shades of gray) by being scattered by various line widths.

Thereafter, particles were filled into the patterned soft polymer mold through a dip coating process. As such, the particles included spherical silica particles having a uniform size of 300 nm. The dip coating process was performed at 200 nm/sec. Further, since the dip coating was determined by surface tension and speed, the above parameters should be optimized for particular process parameters.

Figure 3A:
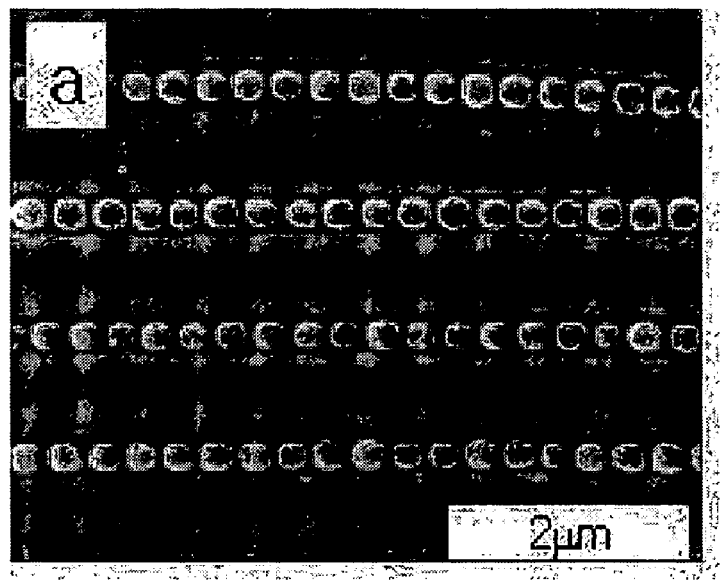
FIG. 3A is an electron micrograph of a stamp including spherical particles self-assembled into a 300 nm sized pattern of the mold.
Figure 3B:
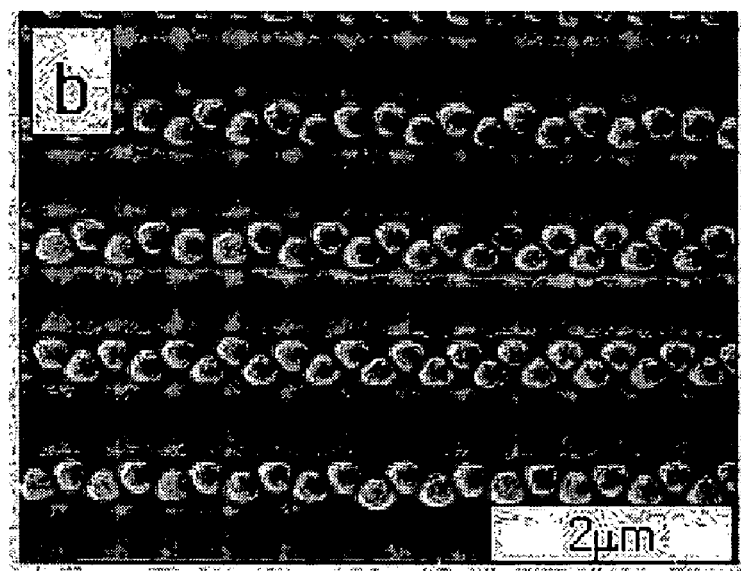
FIG. 3B is an electron micrograph of the stamp including spherical particles self-assembled into a 400 nm sized pattern of the mold.
Figure 3C:
FIG. 3C is an electron micrograph of the stamp including spherical particles self-assembled into a 600 nm sized pattern of the mold.
Figure 3D:
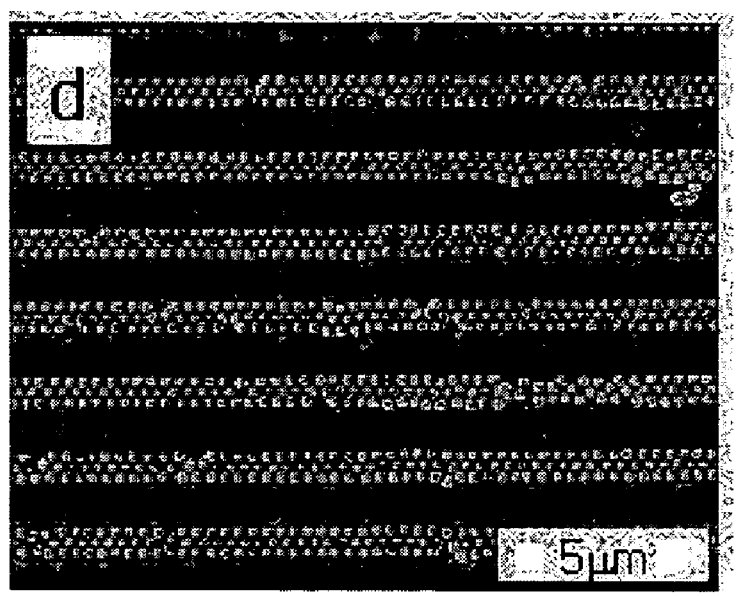
FIG. 3D is an electron micrograph of the stamp including spherical particles self-assembled into a 900 nm sized pattern of the mold.
Figure 3E:
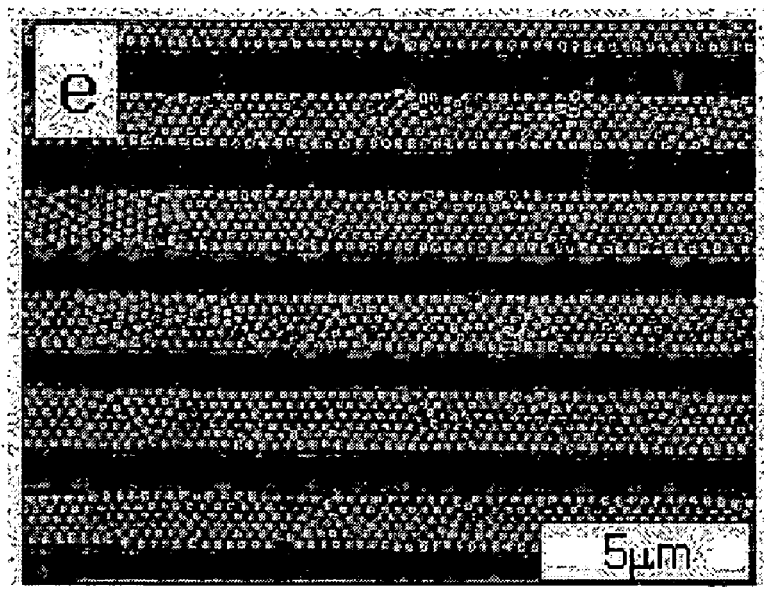
FIG. 3E is an electron micrograph of the stamp including spherical particles self-assembled into a 1800 nm sized pattern of the mold.
Figure 3F:
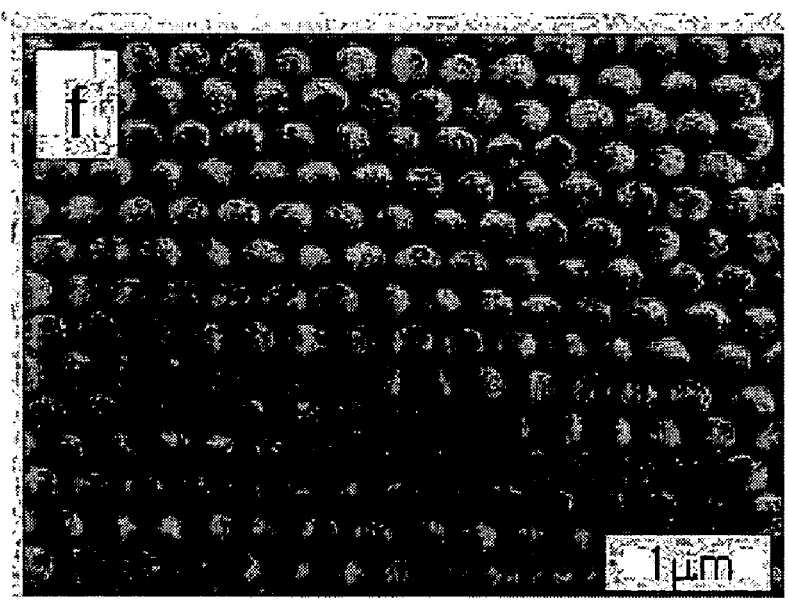
FIG. 3F is an electron micrograph of the stamp including spherical particles self-assembled to the mold without any pattern.
Figure 4A:
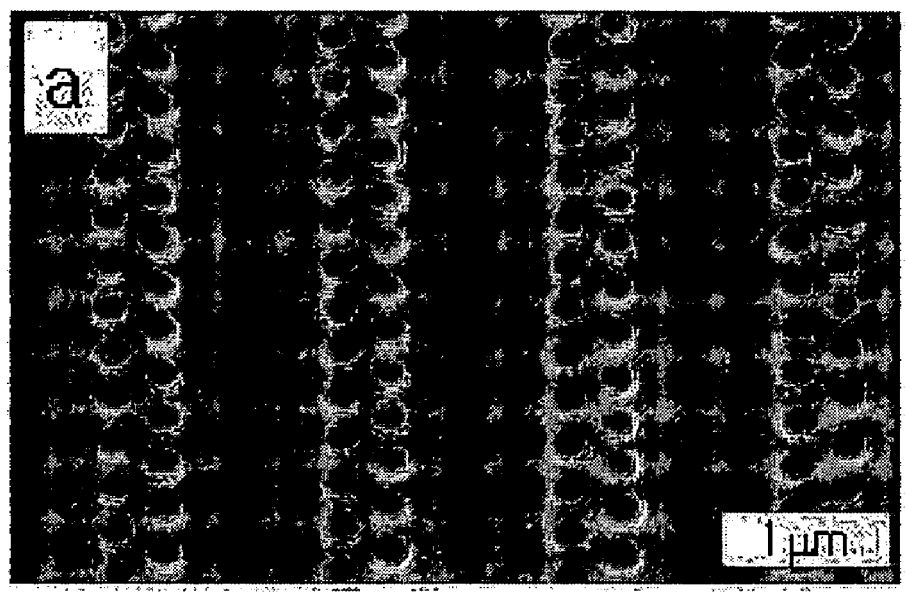
FIG. 4A is an electron micrograph of a patterned porous polymer replicated by the stamp of FIG. 3C using a UV curing process.
Figure 4B:
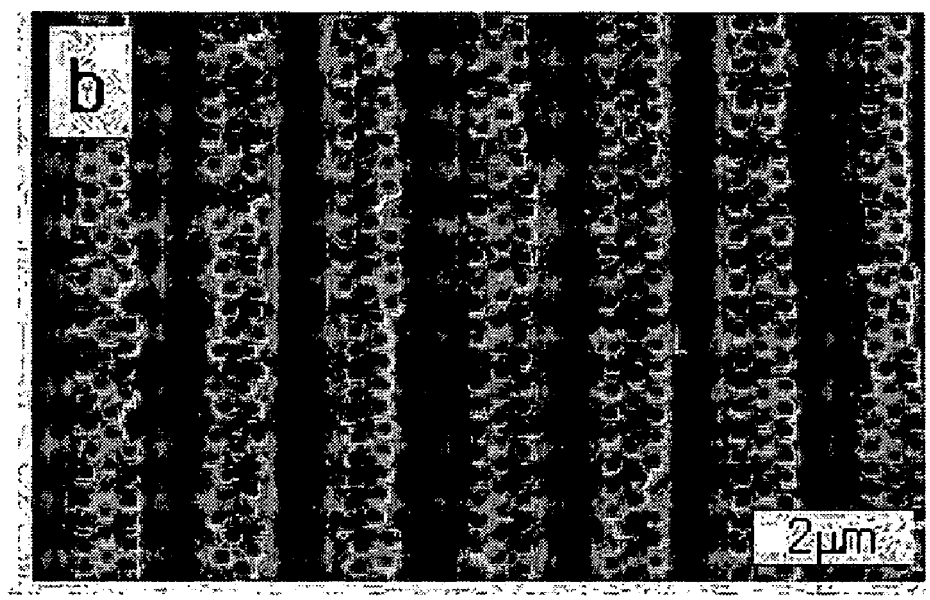
FIG. 4B is an electron micrograph of the patterned porous polymer replicated by the stamp of FIG. 3D using a UV curing process.
Figure 4C:
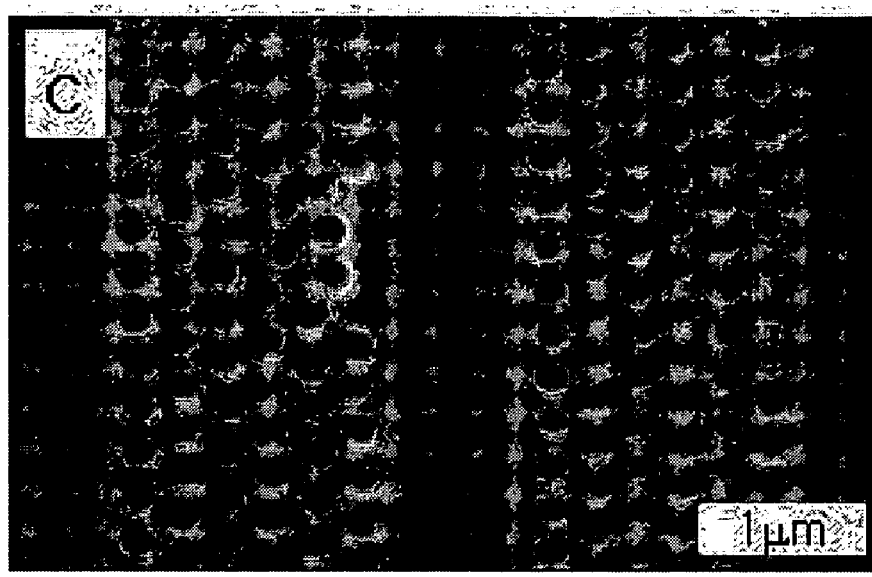
FIG. 4C is an electron micrograph of the patterned porous polymer replicated by the stamp of FIG. 3E using a UV curing process.
Figure 4D:
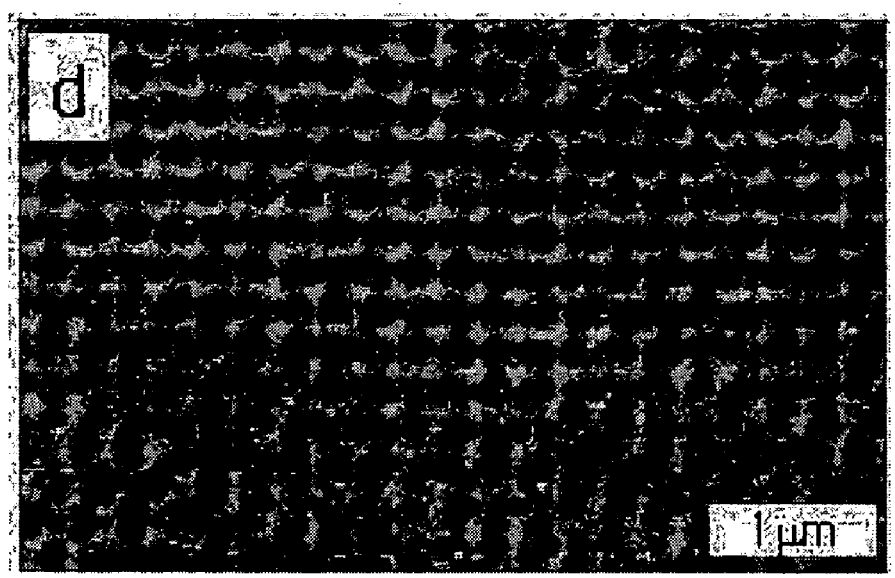
FIG. 4D is an electron micrograph of the patterned porous polymer replicated by the stamp of FIG. 3F using a UV curing process.

FIGS. 3A to 3E are photographs of the stamp, including nanoparticles and the soft polymer mold, formed by self-assembling the 300 nm sized spherical silica particles in channels having various sizes of the soft polymer mold. FIG. 3F is a photograph showing a monolayer of the particles self-assembled on the soft polymer mold without channels.

Moreover, a polyurethane precursor was allowed to flow between the stamp and the substrate using a capillary force, upon preparation of the polymer pattern by the replica molding. The polyurethane precursor was cured under 410 nm UV for 20 min. When the polyurethane precursor was completely cured, the stamp was released from the polyurethane polymer. FIGS. 4A to 4D are electron micrographs of the porous polyurethane fabricated by the replica molding process using the stamp, in which the stamp was previously coated with a gold film (see FIG. 1) to prevent the impregnation of the polymer precursor up to the lower portions of the stamp, thus obtaining the engraved porous polyurethane film having the shapes complementary to those of the particles, as shown in FIGS. 4A to 4D.

EXAMPLE 2

Preparation of Complex Pattern of Polymer and Particles by Replica Molding

Figure 5A:
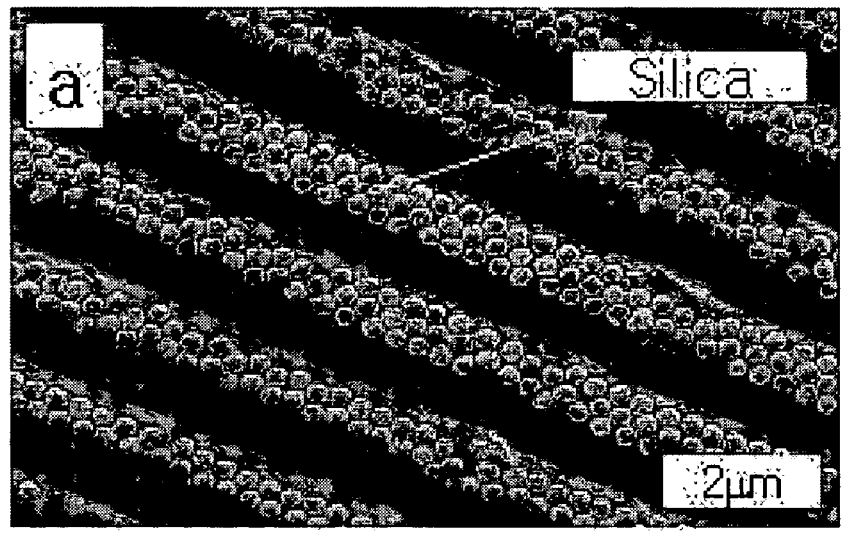
FIG. 5A is an electron micrograph of the spherical particles patterned in polyurethane, obtained by using the stamp of FIG. 3D.
Figure 5B:
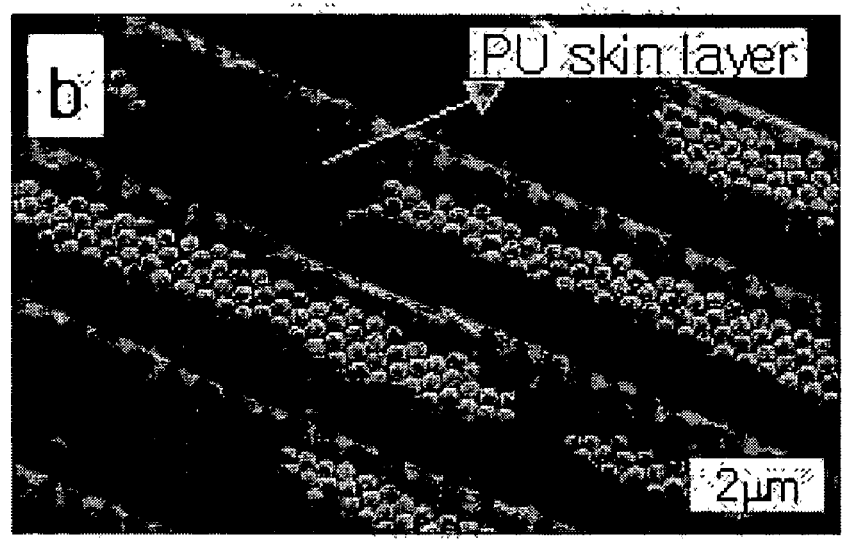
FIG. 5B is an electron micrograph of the spherical particles patterned in polyurethane, obtained by using the stamp of FIG. 3E.
Figure 6A:
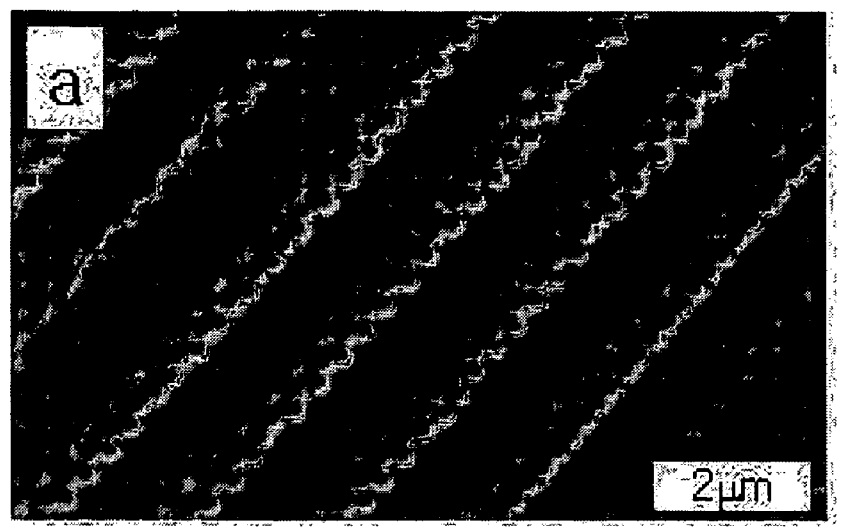
FIG. 6A is an electron micrograph of a porous polymer pattern replicated by the stamp of FIGS. 3A and 3B using a nano-imprinting process.
Figure 6B:
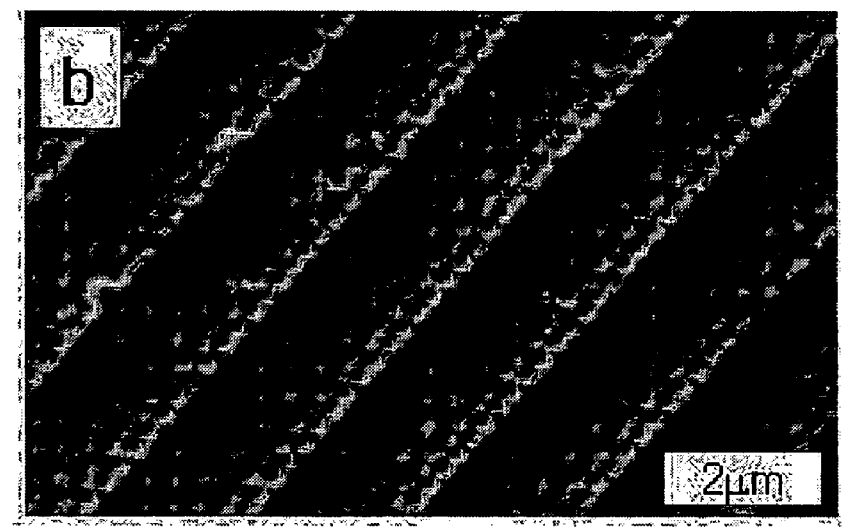
FIG. 6B is an electron micrograph of the porous polymer pattern replicated by the stamp of FIG. 3C using a nano-imprinting process.
Figure 6C:
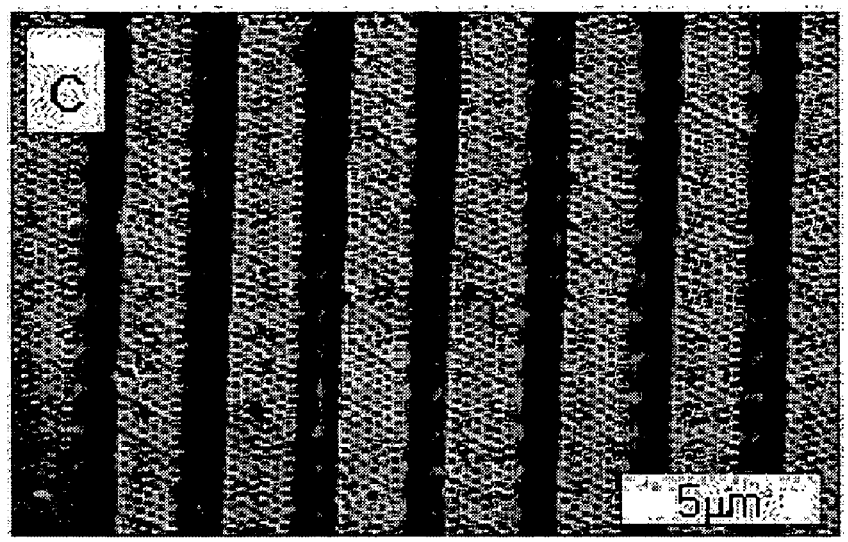
FIG. 6C is an electron micrograph of the porous polymer pattern replicated by the stamp of FIG. 3E using a nano-imprinting process.
Figure 6D:
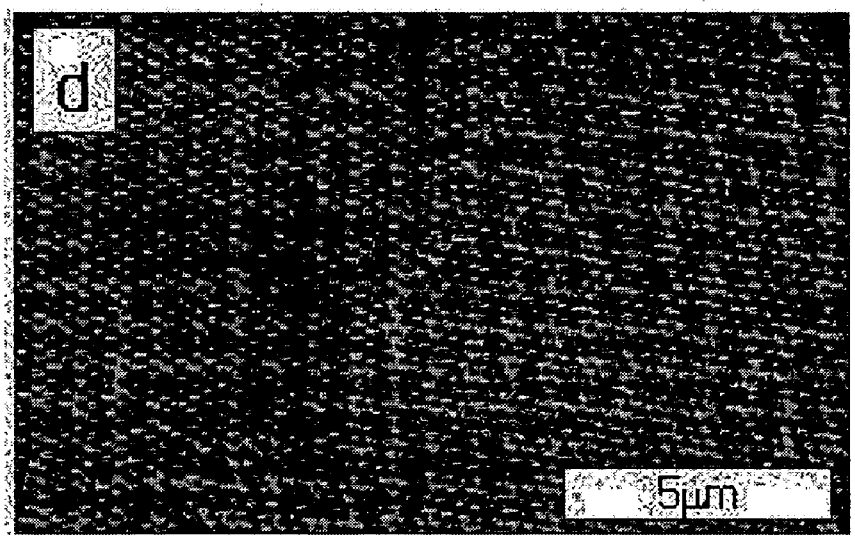
FIG. 6D is an electron micrograph of the porous polymer pattern replicated by the stamp of FIG. 3F using a nano-imprinting process.

Example 2 was prepared similar to Example 1, with the exception that the gold film was not coated on the stamp. In cases where the stamp was not coated (with the gold film serving to prevent the impregnation of the polymer precursor into the stamp), all the particles were separated from the stamp and buried in the polyurethane polymer film. Therefore, as shown in FIGS. 5A and 5B, a complex pattern of embossed silica particles and polymer results resulted, instead of the engraved polymer pattern.

EXAMPLE 3

Preparation of Polymer Pattern by Nano-imprinting (Embossing)

Before the nano-imprinting process, about 1 μm sized polystyrene film was spin-coated onto a silicon wafer and then dried. On the polystyrene coating layer, the gold film-coated stamp shown in FIGS. 3A to 3F was placed and allowed to stand at temperatures higher than a glass transfer temperature of 110° C., at which the polystyrene began to flow. After a predetermined time, the stamp was released, and the engraved porous polystyrene patterns shown in FIGS. 6A to 6D were obtained.

As described hereinbefore, the present invention provides a method of fabricating a patterned polymer film on a nanometer scale. This is advantageous in that polymer patterns having nanometer sized line widths therebetween, which are difficult to realize by a photolithography or electron beam process, can be quickly and inexpensively fabricated at desired positions by use of a self-assembling process and a soft lithography process.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

All documents cited herein are hereby incorporated by reference in their entirety to the same extent as if each individual document was specifically and individually indicated to be incorporated by reference in its entirety.

What is claimed is:

1. A method of fabricating a patterned polymer film, the method comprising:
    filling particles in a pattern provided to a polymer mold, to prepare an embossed stamp;
    coating a polymer impregnation-prevention layer on the pattern;
    placing the embossed stamp on a polymer film;
    allowing the embossed stamp placed on the polymer film to stand at temperatures higher than a glass transfer temperature of the polymer film; and
    removing the embossed stamp from the polymer film.

2. The method of claim 1, wherein the polymer impregnation-prevention layer comprises a metal selected from the group consisting of gold, silver, palladium, copper, chromium and titanium.

3. The method of claim 1, wherein the polymer mold is formed by any of a replica molding process, an imprinting process, a capillary micromolding process, a transfer molding process, a decal transfer molding process and a solvent-assisted micromolding process.

4. The method of claim 1, wherein the particles are selected from the group consisting of polymer beads, metallic materials, ceramic particles, and mixtures thereof.

5. The method of claim 1, wherein the filling is performed by a process selected from the group consisting of a dip coating process, a spin coating process, and a capillary flowing process.

6. The method of claim 1, wherein the polymer film comprises a polymer selected from the group consisting of polystyrene, polymethylmethacrylate, polyacrylate, polyurea, polyurethane, epoxy, polydimethylsiloxane, polyacrylamide, polyvinylalcohol, polybutadiene, polypropylene, polyethylene, polyethyleneoxide, and copolymers thereof.

7. A method of fabricating a patterned polymer film, the method comprising:
    filling particles in a pattern provided to a polymer mold, to prepare an embossed stamp;
    coating a polymer impregnation-preventing layer on the pattern;
    placing the embossed stamp on a coating layer of a polymer precursor formed on a substrate;
    curing the coating layer; and
    removing the embossed stamp from the cured coating layer.

8. The method of claim 7, wherein the polymer impregnation-prevention layer includes any of gold, silver, palladium, copper, chromium and titanium.

9. The method of claim 7, wherein the polymer mold is formed by any of a replica molding process, an imprinting process, a capillary micromolding process, a transfer molding process, a decal transfer molding process, and a solvent-assisted micromolding process.

10. The method of claim 7, wherein the particles include any of polymer beads, metal materials, ceramic particles and mixtures thereof.

11. The method of claim 7, wherein the filling includes any of a dip coating process, a spin coating process, and a capillary flowing process.

12. The method of claim 7, wherein the polymer precursor comprises of polystyrene, polymethylmethacrylate, polyacrylate, polyurea, polyurethane, epoxy, polydimethylsiloxane, polyacrylamide, polyvinylalcohol, polybutadiene, polypropylene, polyethylene, polyethyleneoxide, and copolymers thereof.

* * * * *